(12) United States Patent
Chen et al.

(10) Patent No.: US 8,237,463 B1
(45) Date of Patent: Aug. 7, 2012

(54) METHOD FOR MANAGING CIRCUIT RELIABILITY

(75) Inventors: Fen Chen, Williston, VT (US); Kai D. Feng, Hopewell Junction, NY (US); Zhong-Xiang He, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 13/034,758

(22) Filed: Feb. 25, 2011

(51) Int. Cl.
  *H03K 19/003* (2006.01)
(52) U.S. Cl. .................. 326/9; 326/12; 326/13
(58) Field of Classification Search .......... 326/9–15
  See application file for complete search history.

(56) References Cited

U.S. PATENT DOCUMENTS

| | | | |
|---|---|---|---|
| 5,977,796 A * | 11/1999 | Gabara | 326/86 |
| 6,294,947 B1 * | 9/2001 | Gabara | 327/403 |
| 6,861,865 B1 * | 3/2005 | Carlson | 326/10 |
| 8,115,515 B2 * | 2/2012 | Roper | 326/83 |
| 2008/0284466 A1 * | 11/2008 | Cranford et al. | 326/30 |

* cited by examiner

*Primary Examiner* — Jason M Crawford
(74) *Attorney, Agent, or Firm* — H. Barrett Spraggins; Daniel H. Schnurmann; Biggers & Ohanian, LLP

(57) ABSTRACT

Managing reliability of a circuit that includes a plurality of duplicate components, with less than all of the components being active at any time during circuit operation, where reliability is managed by operating, by the circuit, with a first set of components that includes a predefined number of components; selecting, without altering circuit performance and in accordance with a circuit reliability protocol, a second set of components with which to operate, including activating an inactive component and deactivating an active component of the first set of components; and operating, by the circuit, with the second set of components.

18 Claims, 8 Drawing Sheets

US 8,237,463 B1

METHOD FOR MANAGING CIRCUIT RELIABILITY

BACKGROUND OF THE INVENTION

1. Field of the Invention

The field of the invention is circuit reliability, or, more specifically, methods for managing circuit reliability and circuits with managed reliability.

2. Description of Related Art

Integrated circuits are employed in various technologies, apparatus, and systems. Such integrated circuits are often characterized by several different parameters including yield, performance, and reliability of the circuit. Reliability of integrated circuits is increasingly becoming a more important parameter to those selecting circuits for use in various implementations.

SUMMARY OF THE INVENTION

Methods of managing reliability of a circuit are disclosed in which the circuit includes a plurality of duplicate components, with less than all of the components being active at any time during circuit operation. Managing reliability of such a circuit in accordance with embodiments of the present invention includes: operating, by the circuit, with a first set of components, the first set of components including a predefined number of components; selecting, without altering circuit performance and in accordance with a circuit reliability protocol, a second set of components with which to operate, including activating an inactive component and deactivating an active component of the first set of components, the second set of components also including the predefined number of components; and operating, by the circuit, with the second set of components.

Circuits with managed reliability are also disclosed. Such circuits include: a plurality of duplicate components, with less than all of the components being active at any time during circuit operation; a first set of the components operating in the circuit, the first set including a predefined number of components; and component selection logic configured to select, without altering circuit performance and in accordance with a circuit reliability protocol, a second set of components with which to operate, including activating an inactive component and deactivating an active component of the first set of components, the second set of components also including the predefined number of components.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
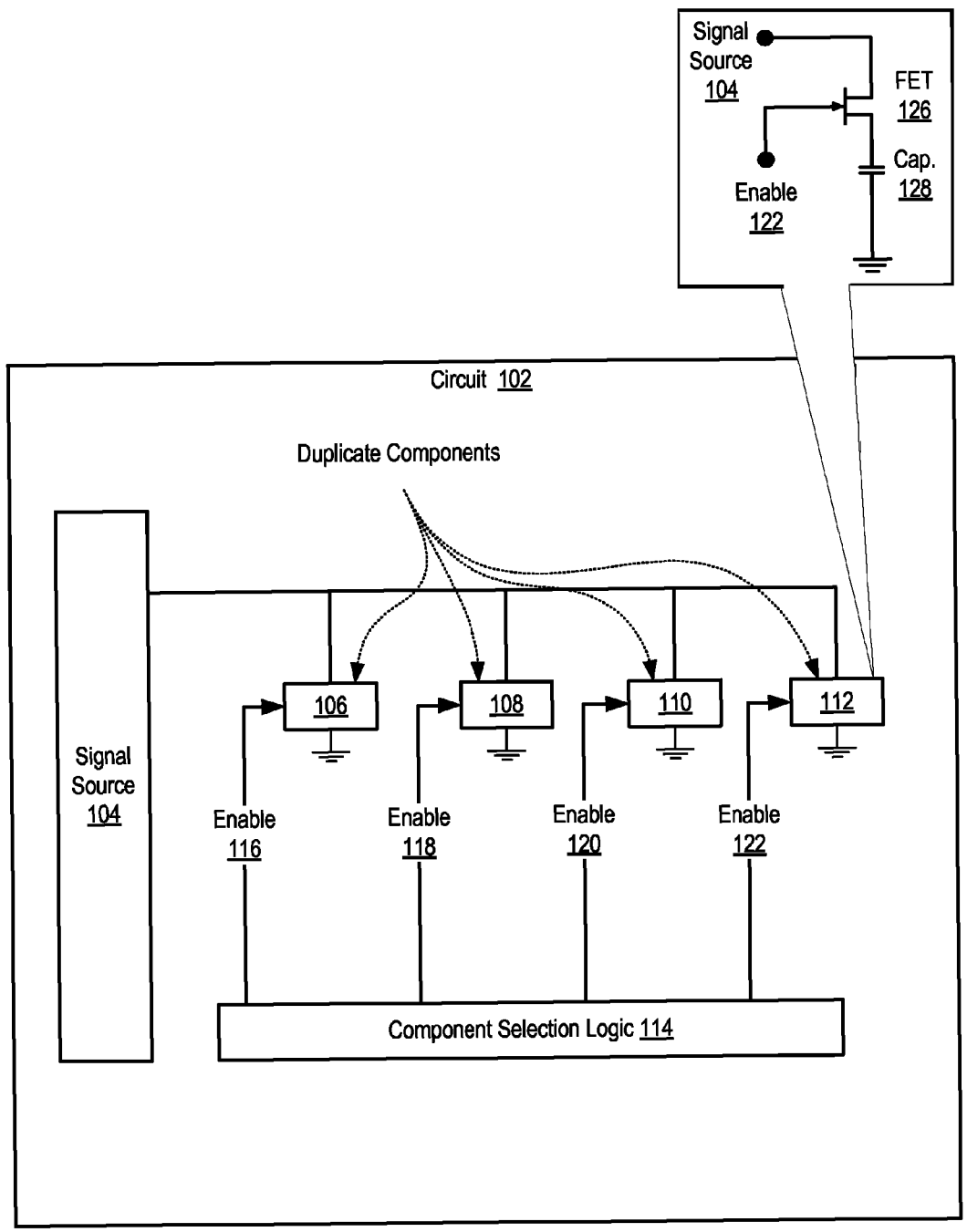
FIG. 1 sets forth a functional block diagram of an exemplary circuit with managed reliability with a single-ended structure in accordance with embodiments of the present invention.

Exemplary methods for managing reliability of a circuit and circuits with managed reliability in accordance with the present invention are described with reference to the accompanying drawings, beginning with FIG. 1. FIG. 1 sets forth a functional block diagram of an exemplary circuit with managed reliability in accordance with embodiments of the present invention. The term 'reliability' is used in this specification to refer to a circuit's operational time without failure—the greater the time before failure, the greater the reliability of a circuit. One way to increase reliability of a circuit is to reduce failure of components forming the circuit.

The circuit (102) in the example of FIG. 1 includes a plurality of duplicate components (106, 108, 110, and 112). A 'component' as the term is used here refers to one or more modules of digital or analog circuitry. Examples of components include resistors, capacitors, inductors, diodes, transistors, gates, operational amplifiers, filters, digital-to-analog converters, and so on as will occur to readers of skill in the art. Two or more components may be duplicates in that the components have the same primary operating characteristics: same capacitance for a capacitor, same resistance for a resistor, same center frequency and bandwidth for a notch filter, and so on as will occur to readers of skill in the art. In the example circuit (102) each of the duplicate components is formed by a switch consisting of a field-effect-transistor (FET) (126) and a capacitor (128).

In the example circuit of FIG. 1, less than all of the components are active at any time during circuit operation. Described another way, at any given time during circuit operation, only a predefined number of the duplicate components may be active. The term 'active' is used here to describe a component that is coupled for operation in the circuit. In the example circuit (102) of FIG. 1, a component is active, when the FET (126) of the component couples the capacitor (128) of the component to the signal source (104). The signal source (104) may be any source of any electrical signal—digital or analog—in a circuit.

Reliability of the example circuit (102) of FIG. 1 is managed in accordance with embodiments of the present invention, in that a first set of the components (106, 108, 110, 112) operates in the circuit. The first set of components includes a predefined number of components. Consider, as an example for purposes of explanation rather than limitation, that at any given time during circuit (102) operation, only two of the four duplicate components (106, 108, 110, and 112) in the circuit may be active—coupled for operation. The first set of component may, in this example, may include component (106) and component (108).

The circuit (102) of FIG. 1 also includes component selection logic (114) configured to select, without altering circuit performance and in accordance with a circuit reliability protocol, a second set of components with which to operate. 'Logic' as the term is used here may refer to one or more modules of digital or analog circuitry. The component selection logic (114) may, for example, be formed of any combination of resistors, capacitors, gates, switches, microprocessors, non-volatile or volatile computer memory, diodes, transistors, and so on as will occur to readers of skill in the art. In selecting the second set of components with which to operate the circuit, the example component selection logic (114) of FIG. 1 activates an inactive component and deactivates an active component of the first set of components. Continuing with the above example in which the first set of components includes component (106) and component (108), the component selection logic may activate component (110)—a previously inactive component—and deactivate component (106) in selecting the second set of components. Described another way, the first set of components includes component (106) and component (108) and the second set of components includes component (108) and component (110). The 'set of components' includes all active components, while all of the other duplicate components are inactive. Each of the duplicate components (106, 108, 110, 112) may be activated or deactivated in the example of FIG. 1 by signaling the component through the component's corresponding enable line (116, 118, 120, 122).

The component selection logic operates in accordance with a circuit reliability protocol. A circuit reliability protocol as the term is used in this specification is a predefined method or process specifying components to be selected for operation in a circuit. Examples of circuit reliability protocols include a protocol that specifies component to be selected in a rotational manner, a protocol that specifies components having least accumulated active times to be selected, a protocol that specifies component selection upon discovery of a component having an unacceptable health indicator, and so on. The term 'health' refers to a component's possibility to fail Many of these protocols are described in detail below.

Regardless of the specifics of the circuit reliability protocol employed by the component selection logic to select a second set of components, the selection of the second set of components does not alter the circuit's performance. That is, from a circuit user's perspective, the circuit performs as expected after selection. In fact, from a circuit user's perspective, the selection may be completely unrecognized or undiscoverable. Consider, as an example that as part of the selection of the second set of components the capacitor forming the component (106) is deactivated concurrently with an activation of the capacitor forming the component (110). In this way, component (106) and component (108)—being identical in primary operating characteristics—operate in parallel as the first set of components in exactly the same way that the component (108) and component (110) of the second set of components operate: as two parallel capacitors having the same capacitance. In effect, operational workload of the circuit is distributed amongst different sets of duplicate components over time. By distributing circuit workload amongst various duplicate components, failures of individual components of the circuit may be managed or reduced. In this way—managing failures of individual components—reliability of the overall circuit (102) is managed.

The example first and second set of components are described here as a set of two components each. The example circuit (102) is illustrated with four duplicate components. Readers of skill in the art will recognize that a circuit configured in accordance with embodiments of the present invention may include any number of duplicate components and a 'set' of components for operation in the circuit may include any number of components—one or more. Further, the arrangement of components (106, 108, 110, and 112), enable lines (116, 118, 120, and 122), signal source (104), and component selection logic (114) illustrated in the example circuit of FIG. 1 is for explanation, not for limitation. Readers of skill in the art will recognize that circuits with reliability managed in accordance with embodiments of the present invention may include a greater or lesser number of duplicate components as well as other circuitry, signal lines, logic, and so on. The circuit (102) in the example of FIG. 1 may also be implemented in a variety of fashions, including for example, as an integrated circuit, as a Field Programmable Gate Array (FPGA), and so on as will occur to readers of skill in the art.

Figure 2:
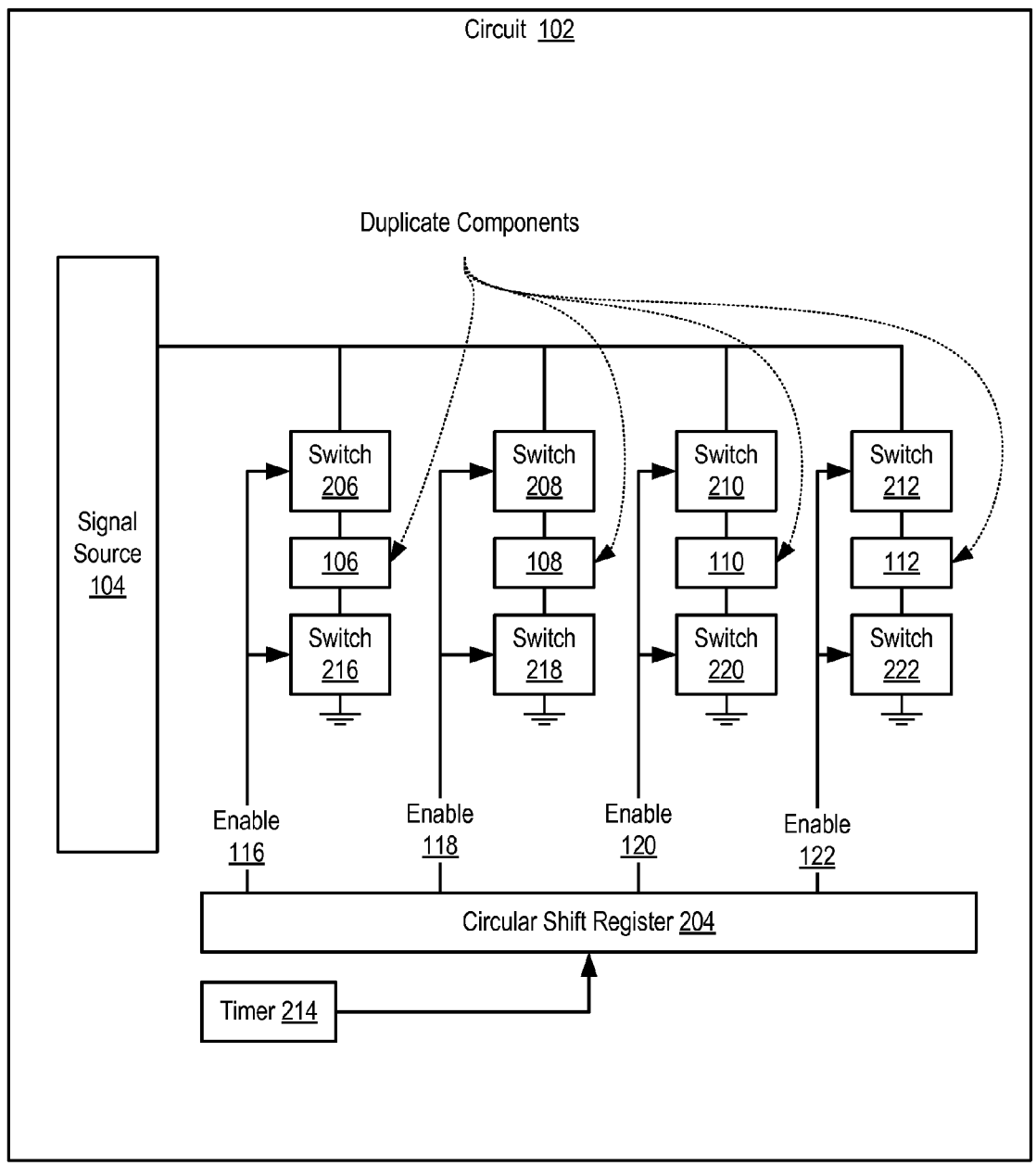
FIG. 2 sets forth a functional block diagram of another exemplary circuit with managed reliability with a differential structure in accordance with embodiments of the present invention.

FIG. 2 sets forth a functional block diagram of another exemplary circuit with managed reliability in accordance with embodiments of the present invention. The example circuit (102) of FIG. 2 is similar to the circuit of FIG. 1 in that the circuit (102) of FIG. 2 includes a plurality of duplicate components, a first set of the components operating in the circuit, and component selection logic configured to select, without altering circuit performance and in accordance with a circuit reliability protocol, a second set of components with which to operate.

In the example circuit of FIG. 2, the circuit reliability protocol employed by the component selection logic specifies selection of the second set of components with which to operate the circuit upon expiration of a predefined period of time and further specifies a rotational selection of subsequent sets of components. That is, the example circuit of FIG. 2 operates in accordance with a periodically rotating component selection circuit reliability protocol, described in detail below.

The example circuit (102) of FIG. 2 operates in accordance with such a circuit reliability protocol in that the component selection logic includes a timer module (214), a circular shift register (204), and a plurality of switches (206, 216, 208, 218, 210, 220, 212, and 222). Each switch is configured to electrically couple a component (106, 108, 110, and 112) for circuit operation. In fact, in the example of FIG. 2, each component is configured to be coupled and decoupled to a signal source (104) by two switches.

The example timer module (214) of the circuit (102) is configured to signal the circular shift register upon the expiration of a predefined period of time. The timer module (214) may be implemented in various ways including for example: as a frequency divider configured to divide a clock signal of the circuit (102) into a low frequency signal, as a programmable timer, or in other ways as will occur to readers of skill in the art.

The circular shift register (204), responsive to the timer module's (214) signaling, is configured to signal a switch (206, 216, 208, 218, 210, 220, 212, and 222) to decouple a component (106, 108, 110, and 112) from circuit operation and signal another switch to couple another component for circuit operation. In the example circuit (102) of FIG. 2, the circular shift register (204) is configured to signal two switches concurrently, through an enable (116, 118, 120, and 122) to couple or decouple a component for circuit operation.

Consider, for further explanation of the component selection in accordance with the periodically rotating component selection component reliability protocol, the following table.

TABLE 1

Example Component States For A
Periodically Rotating Component Circuit Reliability Protocol
With Sets Of Two Active Components

| | Comp. (106) | Comp. (108) | Comp. (110) | Comp. (112) |
|---|---|---|---|---|
| $T_1$ | Active | Active | Inactive | Inactive |
| $T_2$ | Inactive | Active | Active | Inactive |
| $T_3$ | Inactive | Inactive | Active | Active |
| $T_4$ | Active | Inactive | Inactive | Active |

Table 1 above sets forth component states for the duplicate components of the example circuit (102) of FIG. 2 at four subsequent periods of time. At $T_1$, component (106) and component (108) are active; all others are inactive. At $T_2$, component (108) and component (110) are active; all others are inactive. At $T_3$, component (110) and component (112) are active; all others are inactive. At $T_4$, component (112) and component (106) are active; all others are inactive. This rotational selection of components may continuing the same manner over many time periods, effectively distributing operational workload over several redundant and duplicate components.

Figure 3:
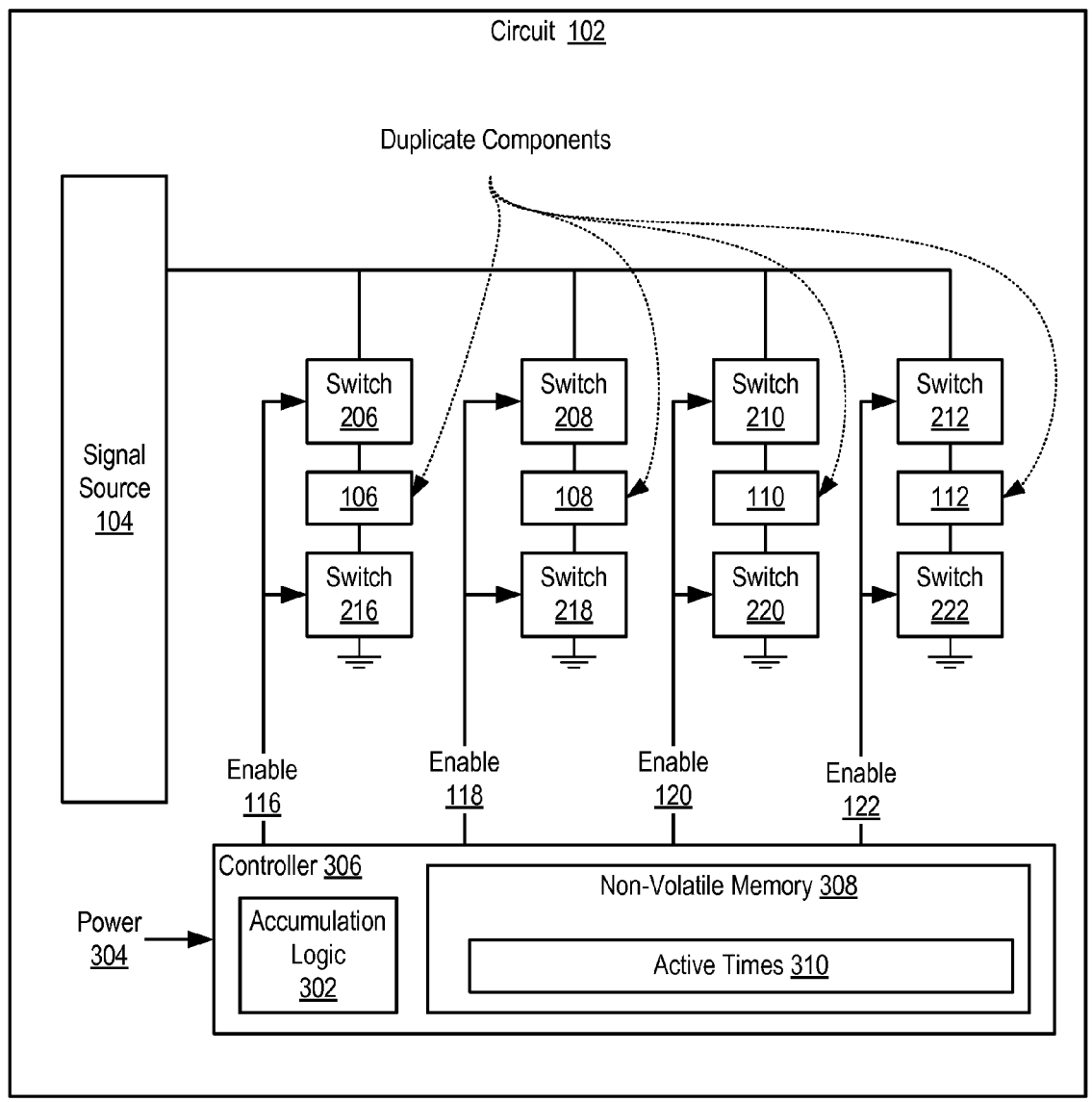
FIG. 3 sets forth a functional block diagram of another exemplary circuit with managed reliability in dependence upon accumulated operating time in accordance with embodiments of the present invention.

FIG. 3 sets forth a functional block diagram of another exemplary circuit with managed reliability in accordance with embodiments of the present invention. The example circuit (102) of FIG. 3 is similar to the circuit of FIG. 1 in that the circuit (102) of FIG. 3 includes a plurality of duplicate components, a first set of the components operating in the circuit, and component selection logic configured to select, without altering circuit performance and in accordance with a circuit reliability protocol, a second set of components with which to operate.

In the example circuit of FIG. 3, the circuit reliability protocol employed by the component selection logic specifies selection of the second set of components with which to operate the circuit in dependence upon the components' accumulated active time. That is, the example circuit of FIG. 3 operates in accordance with a least active component selection circuit reliability protocol. This type of protocol may be employed in various implementations of the circuit (102). For example, one circuit implementation in which the least active component selection circuit reliability protocol may be employed is an implementation in which the circuit experiences a power cycle (a power-off followed by a power on) on a regular basis.

In the example circuit (102) of FIG. 3, however, the component selection logic includes a controller (306), accumulation logic (302), non-volatile memory (308), and a plurality of switches (206, 208, 210, 212, 216, 218, 220, and 222). Each switch (206, 216, 208, 218, 210, 220, 212, 222) is configured to electrically couple a component for circuit operation.

The controller (306) is operatively coupled to the non-volatile memory (308), the plurality of switches, and the accumulation logic (302). In the example of FIG. 3, the controller (306) is described here as 'operatively coupled' to the non-volatile memory (308) and the accumulation logic (302) in that the controller (306) includes the non-volatile memory (308) and accumulation logic (302). In fact, in some embodiments, the accumulation logic may be implemented as software executing in a computer processor of the controller (306) or as one or more modules of digital or analog circuitry.

The accumulation logic (302) in the example of FIG. 3 is configured to accumulate, for each component during circuit operation, an active time (102). Consider, for example, that component (106) operates for two days during a first period of operation and later, after a power cycle (power-off followed by a power-on), operates for another day. The accumulation logic (302) is configured to accumulate three days of active time for the component (106). Accumulation logic (302) in some embodiments is formed of a timer or counter that tracks the active time of a component. The controller (306) in the example circuit (102) of FIG. 3, through use of the accumulation logic (302), is configured to store each component's active time (310) in the non-volatile memory (308).

The example controller (306) of FIG. 3 is also configured to detect a power-on (304) of the circuit, and, responsive to detecting the power-on, select the predefined number of components having the lowest accumulated active times (310). The example controller (306) then signals one or more switches to couple only the selected components for circuit operation.

Figure 4:
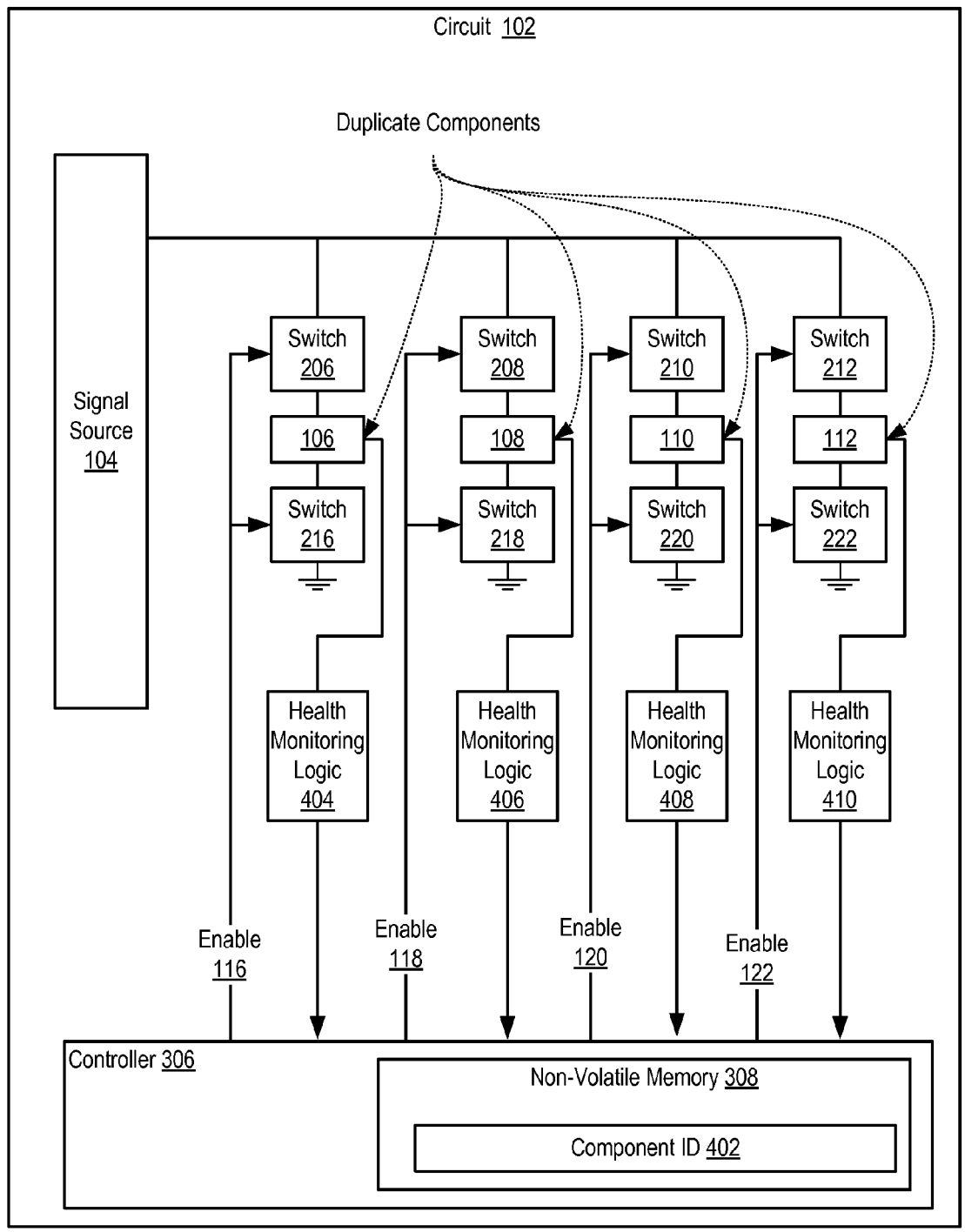
FIG. 4 sets forth a functional block diagram of another exemplary circuit with managed reliability in dependence upon health parameter monitoring in accordance with embodiments of the present invention.

FIG. 4 sets forth a functional block diagram of another exemplary circuit with managed reliability in accordance with embodiments of the present invention. The example circuit (102) of FIG. 4 is similar to the circuit of FIG. 1 in that the circuit (102) of FIG. 4 includes a plurality of duplicate components, a first set of the components operating in the circuit, and component selection logic configured to select, without altering circuit performance and in accordance with a circuit reliability protocol, a second set of components with which to operate.

In the example circuit of FIG. 4, the circuit reliability protocol employed by the component selection logic specifies selection of the second set of components with which to operate the circuit in dependence upon real-time indicators of the components' health. The term 'health' refers to a component's possibility to fail.

The component selection logic in the example circuit (102) of FIG. 4 includes health monitoring logic (404, 406, 408, and 410), a controller (36), non-volatile memory (308), and a plurality of switches (206, 216, 208, 218, 210, 220, 212, 222). The controller (306) in the example of FIG. 4 is operatively coupled to the health monitoring logic (404, 406, 408, and 410), the non-volatile memory (408), and the plurality of switches (206, 216, 208, 218, 210, 220, 212, 222).

The example health monitoring logic (404, 406, 408, 410) of FIG. 4 is configured to monitor, in real-time, a health indicator of each component of the first set. A health indicator is an operating characteristic that, when measured, indicates whether a component is near failure. One example of a health indicator is leakage current of a capacitor. If the leakage current is greater than a predefined threshold, the capacitor is likely near failure.

The health monitoring logic (406) in the example of FIG. 4 is also configured to discover that the health indicator of a component of the first set of active components does not meet acceptability criteria. Acceptability criteria is a specification of an acceptable health indicator for a component.

The controller (306) in the example of FIG. 4 is configured to store in non-volatile memory (308) an identification (402) of the component having the unacceptable health indicator. The controller is also configured to select a component not previously having an unacceptable health indicator. The controller may select a component not previously having an unacceptable health indicator in dependence upon the component identifiers (402) stored in non-volatile memory. The controller (306) may then signal one or more switches to couple the selected component for circuit operation and signal one or more switches to decouple the component having the unacceptable health indicator from circuit operation.

Figure 5:
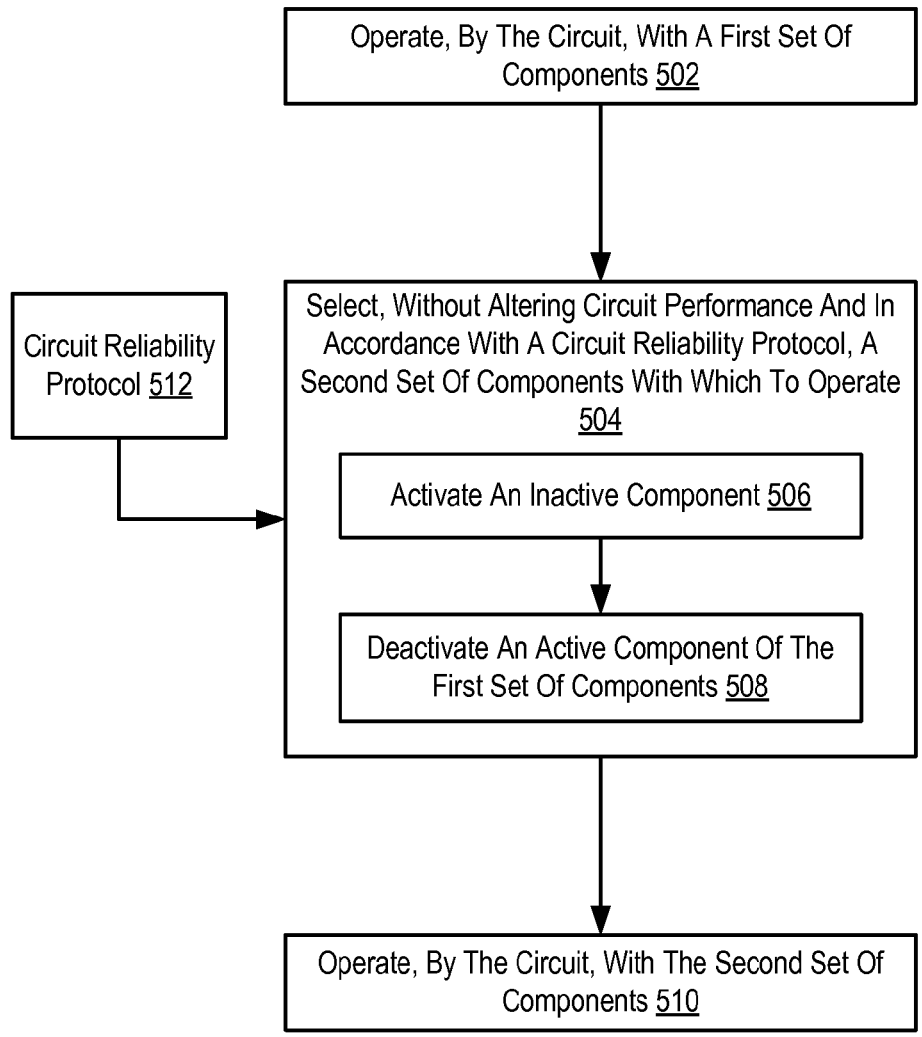
FIG. 5 sets forth a flow chart illustrating an exemplary method for managing circuit reliability according to embodiments of the present invention.

For further explanation, FIG. 5 sets forth a flow chart illustrating an exemplary method for managing circuit reliability according to embodiments of the present invention. The example method of FIG. 5 may be carried out with regard to a circuit similar to the circuit depicted in FIG. 1, which includes a plurality of duplicate components, with less than all of the components being active at any time during circuit operation.

The method of FIG. 5 includes operating (502), by the circuit, with a first set of components. In the example of FIG. 5, the first set of components includes a predefined number of components. The circuit may operate (502) with a set of components by electrically or operatively coupling each of the components in the set of components into main circuit operation with one or more switches.

The method of FIG. 5 also includes selecting (504), without altering circuit performance and in accordance with a circuit reliability protocol (512), a second set of components with which to operate. In the method of FIG. 5, selecting (504) a second set of components with which to operate is carried out by activating (506) an inactive component and deactivating (508) an active component of the first set of components. In the method of FIG. 5, the second set of components includes the predefined number of components—that is, the same number of components as the first set.

The method of FIG. 5 continues by operating (510), by the circuit, with the second set of components. The method of FIG. 5 may be repeated for subsequent sets of components in dependence upon the specification of the circuit reliability protocol (512). Various specifications of the circuit reliability protocol (512) are presented in greater detail with respect to FIGS. 6-8.

Figure 6:
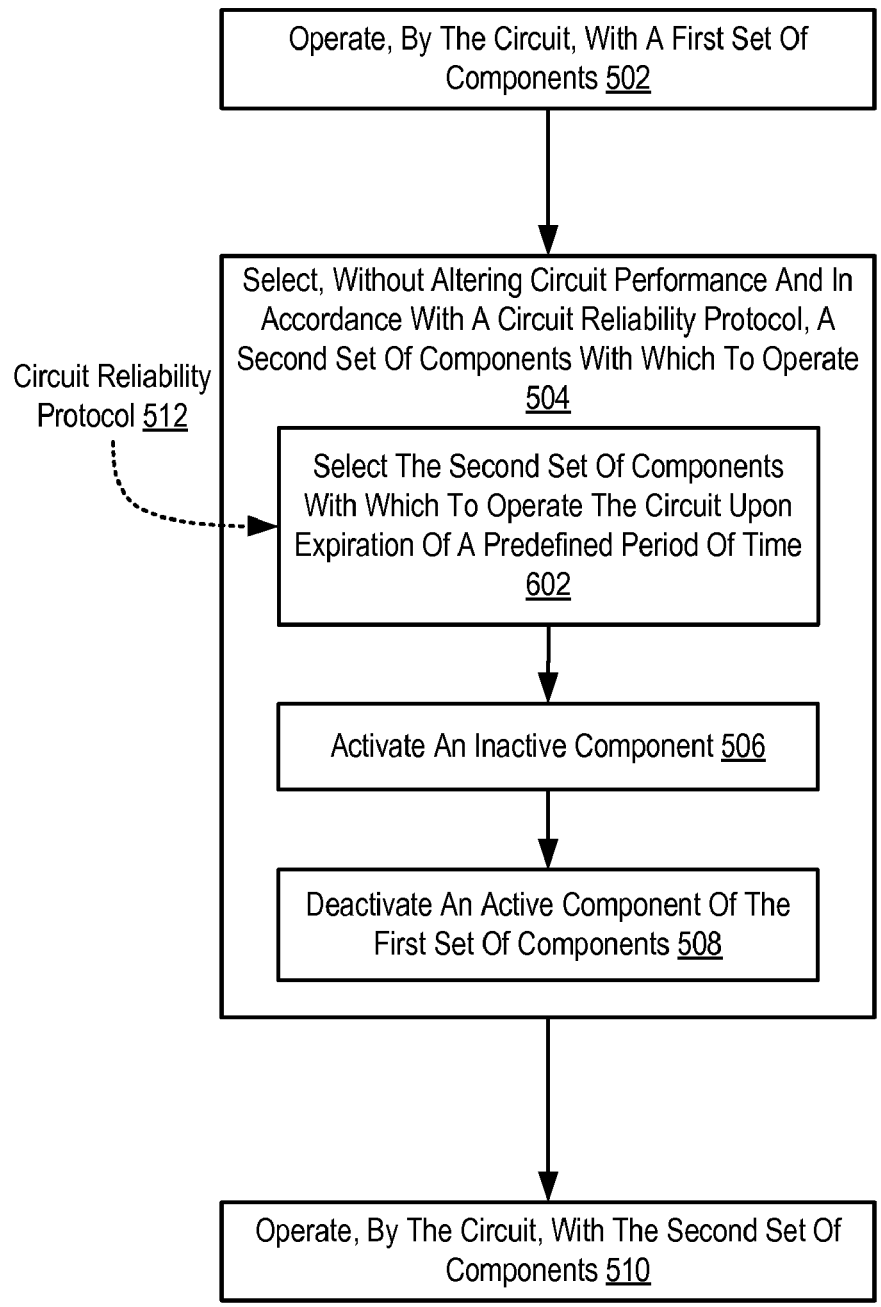
FIG. 6 sets forth a flow chart illustrating a further exemplary method for managing circuit reliability according to embodiments of the present invention.

For further explanation, therefore, FIG. 6 sets forth a flow chart illustrating a further exemplary method for managing reliability of a circuit according to embodiments of the present invention. The method of FIG. 6 is similar to the method of FIG. 5, including as it does, operating (502), by the circuit, with a first set of components, selecting (504) a second set of components with which to operate, and operating (510), by the circuit, with the second set of components.

The method of FIG. 6 differs from the method of FIG. 5, however, in that selecting (504) a second set of components with which to operate is carried out by selecting (602) the second set of components with which to operate the circuit upon expiration of a predefined period of time. Selecting (602) the second set of components with which to operate the circuit upon expiration of a predefined period of time may be carried by various circuit elements including a timer module, a circular shift register, and a plurality of switches, where each switch configured to electrically couple a component for circuit operation. In such an example circuit, the timer module may be configured to signal the circular shift register upon the expiration of the predefined period of time and the circular shift register, responsive to the timer module's signaling, may be configured to signal a switch to decouple a component from circuit operation and signal another switch to couple another component for circuit operation.

Figure 7:
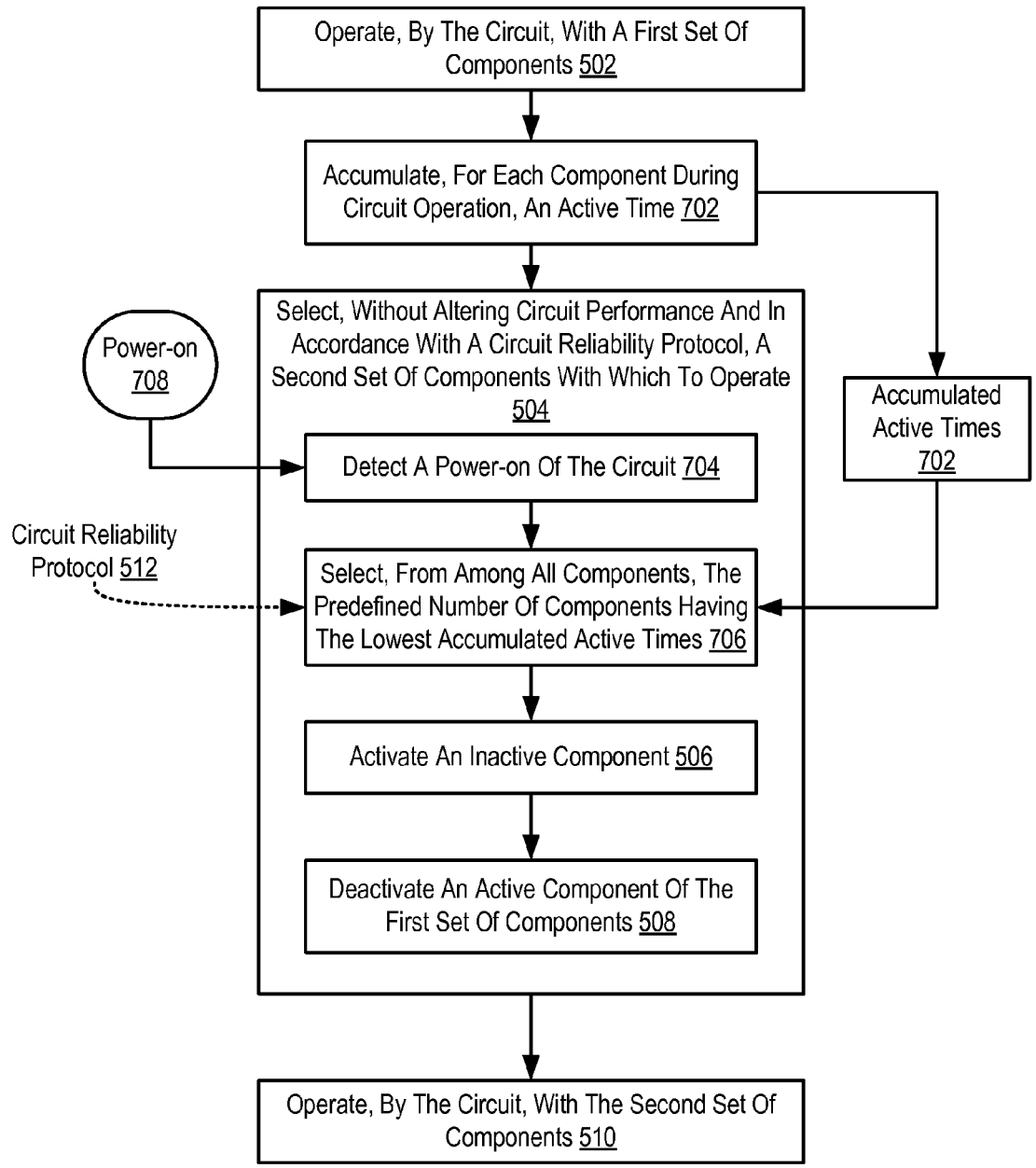
FIG. 7 sets forth a flow chart illustrating a further exemplary method for managing circuit reliability according to embodiments of the present invention.

For further explanation, therefore, FIG. 7 sets forth a flow chart illustrating a further exemplary method for managing reliability of a circuit according to embodiments of the present invention. The method of FIG. 7 is similar to the method of FIG. 5, including as it does, operating (502), by the circuit, with a first set of components, selecting (504) a second set of components with which to operate, and operating (510), by the circuit, with the second set of components.

The method of FIG. 7 differs from the method of FIG. 6, however, in that the method of FIG. 7 includes accumulating (702), for each component during circuit operation, an active time. The method of FIG. 7 also differs from the method of FIG. 6 in that, in the method of FIG. 7, selecting (504) the second set of components with which to operate is carried out by detecting (704) a power-on (708) of the circuit and, responsive to detecting the power-on, selecting (706), from among all components, the predefined number of components having the lowest accumulated active times (702). Accumulating (702) active times, detecting (704) a power-on (708), and selecting (706) components having the lowest accumulated active times (702), may be carried out with various circuit elements including a controller, non-volatile memory, and a plurality of switches. The controller may be operatively coupled to the non-volatile memory and the plurality of switches, with each switch configured to electrically couple a component for circuit operation. The controller may also be configured to accumulate (702) each component's active time; store each component's active time in the non-volatile memory; detect (704) the power-on; select (706) the predefined number of components having the lowest accumulated active times; signal one or more switches to couple the selected components for circuit operation; and signal one or more switches to decouple from circuit operation components of the first set not identified as having the lowest accumulated active times.

Figure 8:
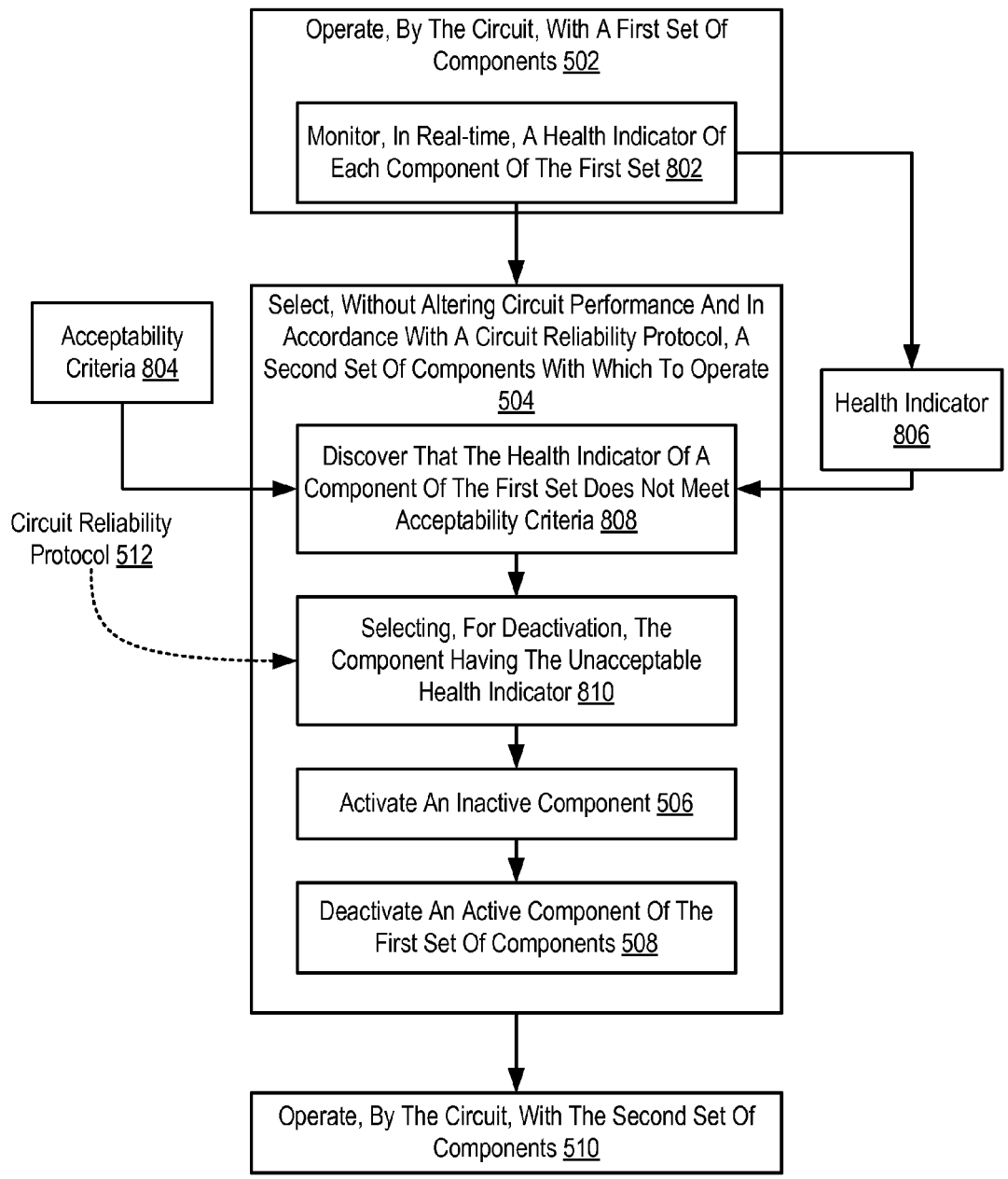
FIG. 8 sets forth a flow chart illustrating a further exemplary method for managing circuit reliability according to embodiments of the present invention.

For further explanation, therefore, FIG. 8 sets forth a flow chart illustrating a further exemplary method for managing reliability of a circuit according to embodiments of the present invention. The method of FIG. 8 is similar to the method of FIG. 5, including as it does, operating (502), by the circuit, with a first set of components, selecting (504) a second set of components with which to operate, and operating (510), by the circuit, with the second set of components.

The method of FIG. 8 differs from the method of FIG. 7, however, in that in the method of FIG. 8 operating (502) with the first set of components includes monitoring (802), in real-time, a health indicator (806) of each component of the first set. In embodiments in which the duplicate components includes capacitors having the same capacitance, monitoring (802) a health indicator includes monitoring current leakage of each active capacitor during circuit operation.

In the method of FIG. 8, selecting (504) the second set of components with which to operate includes discovering (808) that the health indicator of a component of the first set does not meet acceptability criteria (804) and selecting (810), for deactivation, the component having the unacceptable health indicator.

The method of FIG. 8 may be carried out with circuit elements including a controller, non-volatile memory, health monitoring logic, and a plurality of switches. The health monitoring logic may be operatively coupled to the controller, and the controller may be operatively coupled to the non-volatile memory and the plurality of switches. Each switch may be configured to electrically couple a component for circuit operation; the health monitoring logic may be configured to monitor the health indicator of each component of the first set, discover that the health indicator of a component of the first set does not meet acceptability criteria, and signal the controller upon the discovery; and the controller may be configured to store in non-volatile memory an identification of the component having the unacceptable health indicator, select a component not previously having an unacceptable health indicator, signal a switch to couple the selected component for circuit operation, and signal a switch to decouple the component having the unacceptable health indicator from circuit operation.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method for managing reliability of a circuit, the circuit comprising a plurality of duplicate components, each of the components comprising one or more modules of electronic circuitry and each of the components having a same operating characteristic, less than all of the components being active at any time during circuit operation, the method comprising:
    operating the circuit with a first set of the components;
    selecting a second set of the components with which to operate without altering circuit performance and in accordance with a circuit reliability protocol, including deactivating at least one component of the first set and activating at least one other component of the circuit as part of the second set; and
    operating the circuit with the second set of components.

2. The method of claim 1 wherein selecting a second set of components with which to operate further comprises:
    selecting the second set of components with which to operate the circuit upon expiration of a predefined period of time.

3. The method of claim 2 wherein:
    the circuit further comprises a timer module, a circular shift register, and a plurality of switches, each switch configured to electrically couple a component for circuit operation; and
    the timer module is configured to signal the circular shift register upon the expiration of the predefined period of time;
    the circular shift register, responsive to the timer module's signaling, is configured to signal a switch to decouple a component from circuit operation and signal another switch to couple another component for circuit operation.

4. The method of claim 1, further comprising accumulating, for each component during circuit operation, an active time, wherein:
    selecting a second set of components with which to operate further comprises:
    detecting a power-on of the circuit; and
    responsive to detecting the power-on, selecting, from among all components, a predefined number of components having the lowest accumulated active times.

5. The method of claim 4 wherein the circuit further comprises a controller, non-volatile memory and a plurality of switches, the controller operatively coupled to the non-volatile memory and the plurality of switches, each switch configured to electrically couple a component for circuit operation, the controller configured to:
    accumulate each component's active time;
    store each component's active time in the non-volatile memory;
    detect the power-on;
    responsive to detecting the power-on, select the predefined number of components having the lowest accumulated active times;
    signal one or more switches to couple the selected components for circuit operation; and
    signal one or more switches to decouple from circuit operation components of the first set not identified as having the lowest accumulated active times.

6. The method of claim 4 wherein:
    the circuit further comprises a controller, non-volatile memory, health monitoring logic, and a plurality of switches, the health monitoring logic operatively coupled to the controller, the controller operatively coupled to the non-volatile memory and the plurality of switches, wherein:
    each switch is configured to electrically couple a component for circuit operation;
    the health monitoring logic is configured to monitor the health indicator of each component of the first set, discover that the health indicator of a component of the first set does not meet acceptability criteria, and signal the controller upon the discovery; and
    the controller is configured to store in non-volatile memory an identification of the component having the unacceptable health indicator, select a component not previously having an unacceptable health indicator, signal a switch to couple the selected component for circuit operation, and signal a switch to decouple the component having the unacceptable health indicator from circuit operation.

7. The method of claim 6 wherein the plurality of duplicate components comprises a plurality of capacitor having the same capacitance and the health monitoring logic monitors current leakage of each active capacitor during circuit operation.

8. The method of claim 1 wherein:
    operating with the first set of components further comprises monitoring, in real-time, a health indicator of each component of the first set; and
    selecting the second set of components with which to operate further comprises:
    discovering that the health indicator of a component of the first set does not meet acceptability criteria; and
    selecting, for deactivation, the component having the unacceptable health indicator.

9. The method of claim 1 wherein the plurality of duplicate components comprises a plurality of capacitors having the same capacitance.

10. A circuit with managed reliability, the circuit comprising:
    a plurality of duplicate components, each of the components comprising one or more modules of electronic circuitry and each of the components having a same operating characteristic, less than all of the components being active at any time during circuit operation;
    a first set of the components operating in the circuit; and
    component selection logic configured to select a second set of components with which to operate without altering circuit performance and in accordance with a circuit reliability protocol, including deactivating at least one component of the first set and activating at least one other component of the circuit as part of the second set.

11. The circuit of claim 10 wherein the component selection logic is further configured to:
    selecting the second set of components with which to operate the circuit upon expiration of a predefined period of time.

12. The circuit of claim 11 wherein the component selection logic further comprises:
    a timer module, a circular shift register, and a plurality of switches, each switch configured to electrically couple a component for circuit operation;
    wherein:

the timer module is configured to signal the circular shift register upon the expiration of the predefined period of time; and the circular shift register, responsive to the timer module's signaling, is configured to signal a switch to decouple one component from circuit operation and signal another switch to couple another component for circuit operation.

13. The circuit of claim 10, wherein the component selection logic further comprises:

accumulation logic configured to accumulate, for each component during circuit operation, an active time, wherein the component selection logic is further configured to:

detect a power-on of the circuit; and responsive to detecting the power-on, select, from among all components, a predefined number of components having the lowest accumulated active times.

14. The circuit of claim 13 wherein the component selection logic further comprising a controller, non-volatile memory and a plurality of switches, the controller operatively coupled to the non-volatile memory and the plurality of switches, each switch configured to electrically couple a component for circuit operation, wherein the controller is configured to:

accumulate each component's active time;

store each component's active time in the non-volatile memory;

detect the power-on;

responsive to detecting the power-on, select the predefined number of components having the lowest accumulated active times;

signal one or more switches to couple only the selected components for circuit operation.

15. The circuit of claim 10 wherein the component selection logic further comprises:

health monitoring logic configured to monitor, in real-time, a health indicator of each component of the first set; and discover that the health indicator of a component of the first set does not meet acceptability criteria;

wherein the component selection logic is further configured to:

deactivate the component having the unacceptable health indicator; and activate another component.

16. The circuit of claim 15, wherein the component selection logic further comprises a controller, non-volatile memory, and a plurality of switches, the controller operatively coupled to the health monitoring logic, the non-volatile memory and the plurality of switches, wherein:

each switch is configured to electrically couple a component for circuit operation; and the controller is configured to store in non-volatile memory an identification of the component having the unacceptable health indicator, select a component not previously having an unacceptable health indicator, signal a switch to couple the selected component for circuit operation, and signal a switch to decouple the component having the unacceptable health indicator from circuit operation.

17. The circuit of claim 16 wherein the plurality of duplicate components comprises a plurality of capacitors having the same capacitance and the health monitoring logic monitors current leakage of each active capacitor during circuit operation.

18. The circuit of claim 10 wherein the plurality of duplicate components comprises a plurality of capacitors having the same capacitance.

\* \* \* \* \*